US009257265B2

(12) United States Patent
Garcia De Gorordo et al.

(10) Patent No.: US 9,257,265 B2
(45) Date of Patent: Feb. 9, 2016

(54) METHODS FOR REDUCING ETCH NONUNIFORMITY IN THE PRESENCE OF A WEAK MAGNETIC FIELD IN AN INDUCTIVELY COUPLED PLASMA REACTOR

(71) Applicant: APPLIED MATERIALS, INC., Santa Clara, CA (US)

(72) Inventors: Alvaro Garcia De Gorordo, San Francisco, CA (US); Waheb Bishara, Menlo Park, CA (US); Samer Banna, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/206,723

(22) Filed: Mar. 12, 2014

(65) Prior Publication Data
US 2014/0273304 A1    Sep. 18, 2014

Related U.S. Application Data

(60) Provisional application No. 61/786,683, filed on Mar. 15, 2013.

(51) Int. Cl.
*H01L 21/66* (2006.01)
*H01J 37/32* (2006.01)

(52) U.S. Cl.
CPC ........... *H01J 37/3266* (2013.01); *H01J 37/321* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,429,070 A * | 7/1995 | Campbell | ............. | C23C 16/513 118/719 |
| 6,805,770 B1 * | 10/2004 | Oster | .................. | H01J 37/3266 118/723 MA |
| 8,593,064 B2 * | 11/2013 | Chang Diaz | .......... | F03H 1/0093 315/111.61 |
| 2004/0182516 A1 | 9/2004 | Lindley et al. | | |
| 2008/0257261 A1 | 10/2008 | Hanawa et al. | | |
| 2008/0296259 A1 * | 12/2008 | Shin | .................. | H01J 37/32091 216/67 |
| 2008/0311758 A1 * | 12/2008 | Bailey | ................... | H01J 37/321 438/732 |
| 2010/0014640 A1 * | 1/2010 | Balakin | ..................... | H01J 3/04 378/65 |
| 2011/0094994 A1 | 4/2011 | Todorow et al. | | |
| 2011/0097901 A1 | 4/2011 | Banna et al. | | |
| 2011/0220494 A1 * | 9/2011 | Ding | .................. | H01J 37/3408 204/298.17 |
| 2012/0097870 A1 | 4/2012 | Leray et al. | | |
| 2012/0242229 A1 * | 9/2012 | Hoffman | .................. | H05H 1/46 315/111.51 |

(Continued)

*Primary Examiner* — Alexander Ghyka
(74) *Attorney, Agent, or Firm* — Moser Taboada; Alan Taboada

(57) ABSTRACT

Methods and apparatus for plasma-enhanced substrate processing are provided herein. In some embodiments, a method is provided for processing a substrate in a process chamber having a plurality of electromagnets disposed about the process chamber to form a magnetic field within the process chamber at least at a substrate level. In some embodiments, the method includes determining a first direction of an external magnetic field present within the process chamber while providing no current to the plurality of electromagnets; providing a range of currents to the plurality of electromagnets to create a magnetic field within the process chamber having a second direction opposing the first direction; determining a desired magnitude in the second direction of the magnetic field over the range of currents; and processing a substrate in the process chamber using a plasma while statically providing the magnetic field at the desired magnitude.

16 Claims, 3 Drawing Sheets

(56) References Cited

U.S. PATENT DOCUMENTS

| | | | |
|---|---|---|---|
| 2012/0298303 A1* | 11/2012 | Ikeda | H01J 37/3211 156/345.48 |
| 2013/0062311 A1* | 3/2013 | Liu | H01J 37/32669 216/68 |
| 2013/0140984 A1* | 6/2013 | Hirayama | H01J 37/32082 315/39 |
| 2014/0027278 A1* | 1/2014 | Ohmi | C23C 14/35 204/298.16 |
| 2014/0174661 A1* | 6/2014 | Kim | H01J 37/321 156/345.44 |

* cited by examiner

METHODS FOR REDUCING ETCH NONUNIFORMITY IN THE PRESENCE OF A WEAK MAGNETIC FIELD IN AN INDUCTIVELY COUPLED PLASMA REACTOR

CROSS-REFERENCE TO RELATED APPLICATIONS

This application claims benefit of U.S. provisional patent application Ser. No. 61/786,683, filed Mar. 15, 2013, which is herein incorporated by reference in its entirety.

FIELD

Embodiments of the present invention generally relate to plasma enhanced semiconductor substrate processing.

BACKGROUND

As uniformity requirements for better yield control are getting tighter and tighter, for example, as moving towards 20 nm node technology and beyond, any residual skew in a plasma reactor will limit reaching the tight specification for etch uniformity. The inventors believe that external magnetic field interference is among the few remaining skew sources that need to be addressed to achieve such a tight uniformity specification.

Thus, the inventors have provided embodiments of improved plasma-enhanced substrate process chambers.

SUMMARY

Methods and apparatus for plasma-enhanced substrate processing are provided herein. In some embodiments, a method is provided for processing a substrate in a process chamber having a plurality of electromagnets disposed about the process chamber to form a magnetic field within the process chamber at least at a substrate level. In some embodiments, the method includes determining a first direction of an external magnetic field present within the process chamber while providing no current to the plurality of electromagnets; providing a range of currents to the plurality of electromagnets to create a magnetic field within the process chamber having a second direction opposing the first direction; determining a desired magnitude in the second direction of the magnetic field over the range of currents; and processing a substrate in the process chamber using a plasma while statically providing the magnetic field at the desired magnitude.

In some embodiments, a method of processing a substrate in a process chamber having a plurality of electromagnets disposed about the process chamber to form a magnetic field within the process chamber at least at a substrate level includes determining a first direction of an external magnetic field present within the process chamber while providing no current to the plurality of electromagnets; sequentially providing a range of currents to the plurality of electromagnets to create a plurality of magnetic fields within the process chamber, each having a second direction opposite the first direction, wherein the second direction is substantially horizontal; determining a first magnetic field having a desired magnitude in the second direction of the plurality of magnetic fields over the range of currents; and processing a substrate in the process chamber using a plasma while statically providing the first magnetic field at the desired magnitude.

In some embodiments, the method includes providing a plurality of currents over a range of values to the plurality of electromagnets to sequentially form a plurality of magnetic fields within the process chamber; measuring a magnitude of each of the plurality of magnetic fields; determining a first magnetic field having a desired magnitude from the plurality of magnetic fields; and processing a substrate in the process chamber using a plasma while statically providing the first magnetic field.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
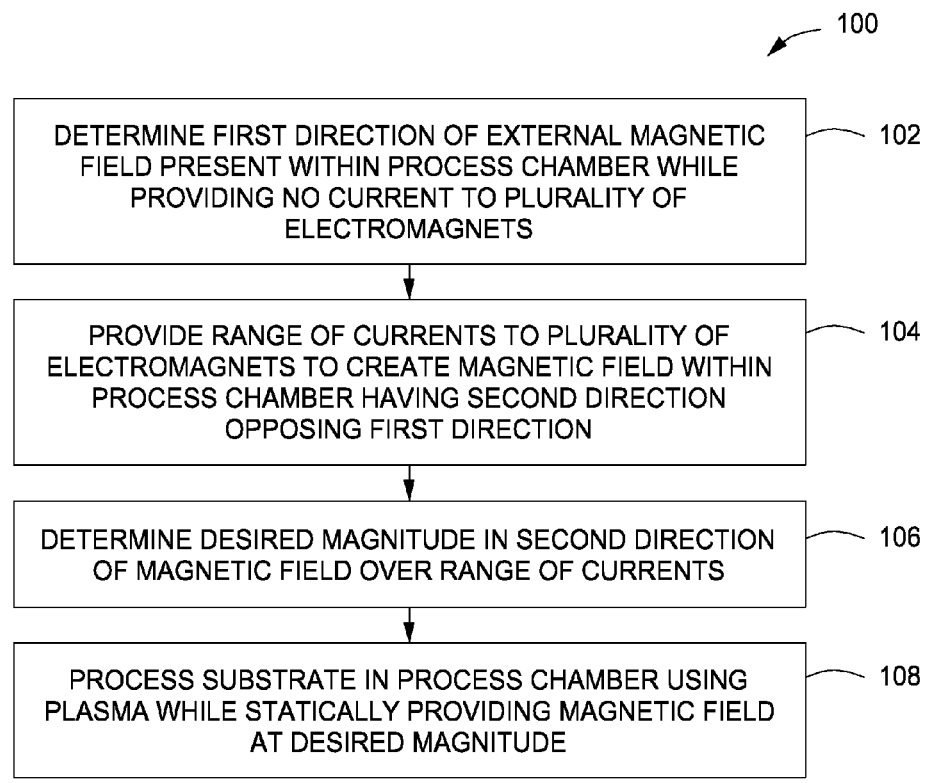
FIG. 1 depicts a flow chart of a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention related to plasma-enhanced semiconductor process chambers. Embodiments of the present invention can advantageously reduce on-wafer process skew due to small magnetic fields. The inventors have observed that skew can be caused at least in part by external electromagnetic interference. In the past, when the uniformity specification was relatively high, the effect of external electromagnetic interference was not noticed. However, as process improvements have been made, and as the uniformity specification becomes increasingly tight, the inventors have now observed external electromagnetic interference as a source of skew. Skew can generally refer to the difference in process results from one region of the substrate to another, such as left vs. right, center vs. edge, top vs. bottom of a feature, or the like (e.g., skew can refer to the pattern of non-uniformity on the substrate). Skew can be used to characterize process results such as critical dimension (CD) uniformity, etch depth uniformity, or other process results.

As used herein, external electromagnetic interference refers to interference from electromagnetic fields not purposefully created within a process chamber, referred to herein as an external magnetic field. As used herein, the term external magnetic field does not refer to the location of the magnetic field, which can be internal to the process chamber. The term external magnetic field refers only to the source of the magnetic field, namely, from external electromagnetic interference. Sources of external electromagnetic interference include many sources surrounding the chamber, such as the Earth's magnetic field (typically on the order of about 0.3 gauss, although the exact value may vary even as between adjacent process chambers), magnetized parts of the mainframe such as structural steel, DC magnets in motors used for moving parts (cathode, lift pins, robots, etc.), interference from adjacent chambers, or the like. The inventors have discovered that a magnetic field of as low as 0.1 gauss can affect the overall skew in certain processes, once the overall skew magnitude is reduced significantly. Embodiments of the present invention may advantageously reduce, control, or eliminate skew induced by external magnetic field interference in industrial plasma etch reactors.

In some embodiments, a set of current carrying coils (e.g., electromagnets) surround a plasma chamber in a symmetrical fashion and produce a magnetic field that counters a detected magnetic field in the environment (e.g., an external magnetic field) or achieves a different desired field configuration. In some embodiments, the horizontal component of the magnetic field is minimized. Alternatively or in combination, in some embodiments, the vertical component of the magnetic field may be minimized. In some embodiments, the electromagnet coils are positioned such that a horizontal field in any direction can be achieved by turning on an appropriate combination of coils with appropriate current values.

For example, to minimize the external magnetic field inside the chamber volume, the external magnetic field can be measured inside the chamber or outside the chamber near the chamber walls. A magnetic field sensor can be used during a defined calibration procedure or continuously during processing, as described in more detail, below. Thus, embodiments of the present invention advantageously provide for control and reduction of unwanted external electromagnetic interference in a plasma process. The reduction in the external electromagnetic interference may advantageously facilitate control over the process skew direction and magnitude. Thus, process skew can advantageously be minimized or controlled to compensate for incoming process skew due to previous processing steps.

Process skew due to external electromagnetic interference can be determined and minimized by measuring and compensating for the external magnetic field. This can be done during a calibration procedure which does not involve running process substrates, or wafers. The calibration procedure can be completed upon chamber start up to set up the overall current in each coil for a fixed value. The procedure can be repeated as desired, for example, upon chamber cleaning, after a certain number of substrates are processed, or the like. The measurement of the external magnetic field can be performed externally without opening the chamber by using a fixture to hold a magnetic field sensor at a desired location near the process chamber, such as the chamber walls or lid isolating the inductively coupled plasma source from the vacuum chamber body.

FIG. 1 depicts an exemplary method 100 for processing a substrate in accordance with embodiment of the present invention. The method 100 generally begins at 102 where a first direction of an external magnetic field present within a process chamber is determined. The first direction of the external magnetic field is determined while providing no current to a plurality of electromagnets surrounding the process chamber. The first direction of the external magnetic field may be determined using one or more magnetic field sensor, (e.g., a gauss sensor) that can measure the magnetic field in three dimensions (e.g., x, y, z). Alternatively, separate sensors may be used to measure the magnetic field in different directions. The magnetic field sensor may be provided near the process chamber lid (e.g., at or near a central axis of the process chamber), or at a plurality of locations about the process chamber (internally or externally), for example, at about substrate level. At any time the direction of the external magnetic field is determined, the magnitude may also be determined.

Next, at 104, a range of currents are sequentially provided to the plurality of electromagnets to create a sequential plurality of magnetic fields within the process chamber each having a second direction. In some embodiments, the second direction is opposite the first direction. Alternatively, in some embodiments, the second direction may be a direction other than opposite the first direction. The range of currents may be selected to form a plurality of magnetic fields having a magnitude of about 0.01 to about 10 gauss, or about 0.5 gauss. The current and voltage may vary depending upon the electromagnet configuration (for example, wire gauge and number of turns of the electromagnets). For example, the currents may be provided over a given range (e.g., from about −1 to about 1 amp), with measurements taken at a given interval (e.g., about every 0.1 amps).

At 106, a first magnetic field of the sequential plurality of magnetic fields having a desired magnitude in the second direction is determined. For example, over the range of currents, the magnitude of each magnetic field of the plurality of magnetic fields will vary. A magnetic field having a desired magnitude may be selected (e.g., a first magnetic field). The desired magnitude may be the minimum magnitude in the second direction. In some embodiments, the desired magnitude may be other than the minimum magnitude.

Next, at 108, a substrate may be processed in the process chamber using a plasma while statically providing the first magnetic field at the desired magnitude. For example, in some embodiments, where merely minimizing the effect of the external magnetic field is desired, the second direction of the sequential created plurality of magnetic fields may be opposite the direction of the external magnetic field (e.g., the first direction) and the magnetic field selected from the plurality of magnetic fields may by the one with the smallest magnitude. Alternatively, to compensate for a known incoming process skew on a substrate or lot of substrates, either or both of the second direction or the desired magnitude may be selected to impose a purposeful process skew that compensates for the existing skew on the incoming substrates, thereby providing etched substrate having reduced or eliminated skew. Upon completion of processing the substrate the method 100 generally ends.

Figure 5:
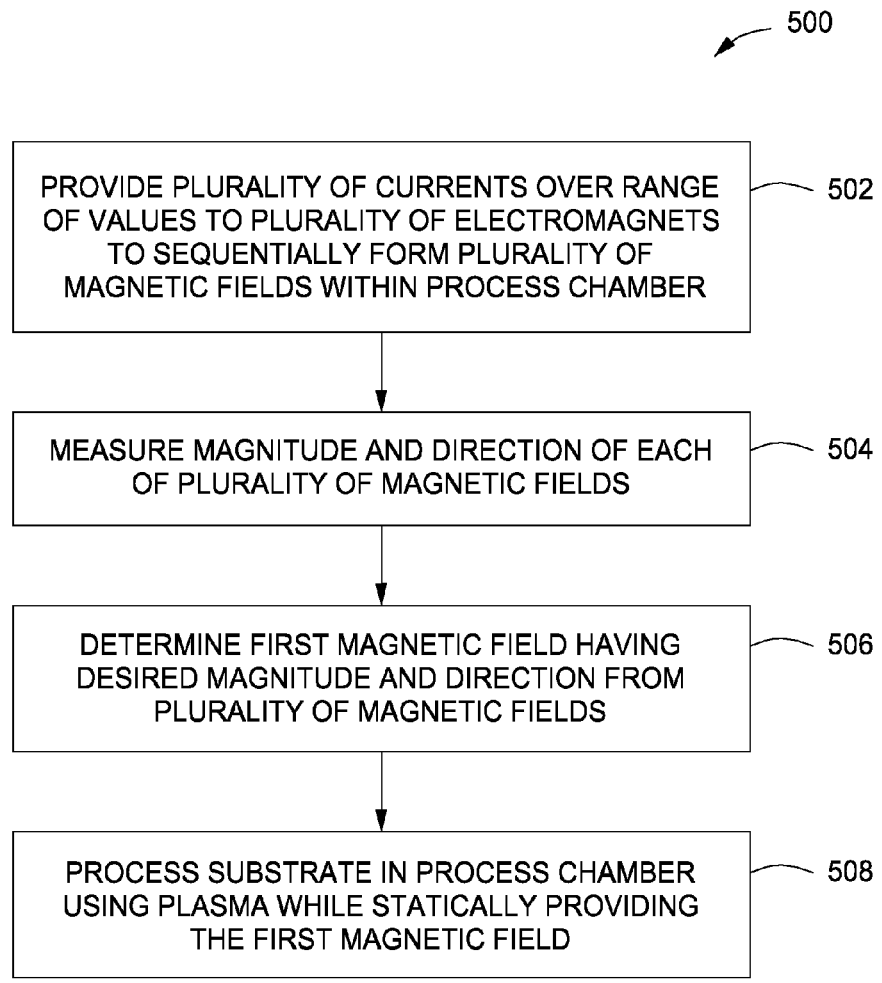
FIG. 5 depicts a flow chart of a method for processing a substrate in accordance with some embodiments of the present invention.

Although the above methodology describes explicitly determining the direction of the existing magnetic field, other embodiments of the present invention can determine a desired magnetic field for improved processing without explicitly determining the direction of the existing magnetic field. For example, FIG. 5 depicts a flow chart of a method 500 for processing a substrate in accordance with some embodiments of the present invention.

The method 500 generally begins at 502 where a plurality of currents are provided over a range of values to the plurality of electromagnets to sequentially form a plurality of magnetic fields within the process chamber. At 504, a magnitude and, optionally, direction of each of the plurality of magnetic fields may be measured. By comparing the magnitudes and, and optionally, directions of the plurality of magnetic fields, at 506 a first magnetic field having a desired magnitude and, optionally, a desired direction from the plurality of magnetic fields can be determined. At 508, a substrate can be processed in the process chamber using a plasma while statically providing the first magnetic field. Similarly as discussed above, The desired magnitude and direction can be selected to minimize the skew that would otherwise be imposed by the external magnetic field, or to purposely impose a process skew to compensate for an incoming substrate with a known skew.

Figure 2:
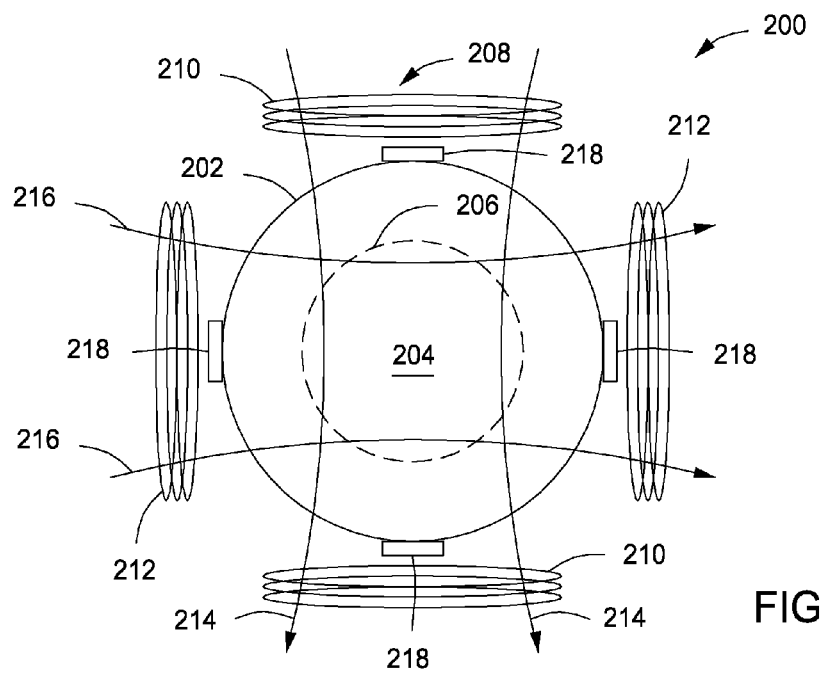
FIG. 2 depicts a schematic top view of a plasma reactor having a plurality of electromagnets surrounding a process chamber in accordance with some embodiments of the present invention.

FIG. 2 depicts a top view of a process chamber 200 suitable for performing embodiments of the methods of the present invention. The process chamber 200 generally includes a chamber body 202 having an inner volume 204. A substrate support for supporting a substrate 206 is disposed within the inner volume 204 (as depicted in phantom).

A plurality of electromagnets 208 may be disposed about the chamber body 202 to provide a variable magnetic field within the inner volume 204 of the process chamber 200 at least at substrate level, and in some embodiments, within the entire inner volume 204. In some embodiments, the plurality of electromagnets 208 may provide a substantially horizontal magnetic field, or in some embodiments, a substantially vertical magnetic field, or in some embodiments, a magnetic field having other orientations.

In the non-limiting embodiment depicted in FIG. 2, a first pair of electromagnets 210 are disposed on opposing sides of the chamber body 202 and a second pair of electromagnets 212 are disposed on opposing sides of the chamber body 202 generally perpendicular to the first pair of electromagnets 210. In some embodiments, the first pair of electromagnets 210 are configured to provide a generally horizontal magnetic field as indicated by magnetic field lines 214. Similarly, in such embodiments, the second pair of electromagnets 212 are configured to provide a generally horizontal magnetic field as indicated by magnetic field lines 216. Each electromagnet, or pair of electromagnets, is coupled to a power supply, such as a DC power supply, to provide a variable current to the electromagnet or pair of electromagnets in order to form the magnetic fields described above.

One or more magnetic field sensors 218 may be provided about the chamber body 202 to provide data corresponding to the magnitude of the magnetic field within the inner volume 204. The one or more magnetic field sensors 218 may be disposed in any suitable location about the chamber body 202, or within the inner volume 204 of the chamber body 202. In the embodiment depicted in FIG. 2, four magnetic field sensors 218 are provided in axial alignment with each of the respective electromagnets of the first pair of electromagnets 210 and the second pair of electromagnets 212. In some embodiments, a controller is provided to control the electromagnets and to read the data from the one or more magnetic field sensors 218.

Figure 3:
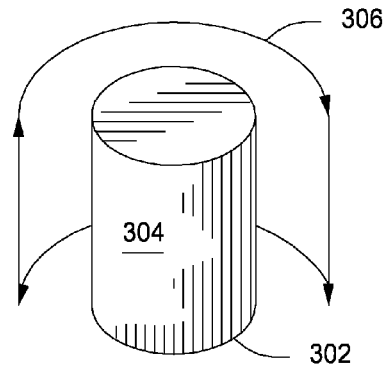
FIG. 3 depicts a schematic isometric view of a plasma reactor and an electromagnet disposed about the plasma reactor in accordance with some embodiments of the present invention.

FIG. 3 depicts a schematic isometric view of a process chamber 302 having an internal volume 304. An illustrative electromagnet 306 is disposed adjacent to and about the process chamber 302. Arrows on the electromagnet 306 illustrate flow of current through the electromagnet 306. Current may also flow in the opposite direction. A plurality of electromagnets 306 may be provided to facilitate formation of the plurality of magnetic fields discussed above.

Figure 4:
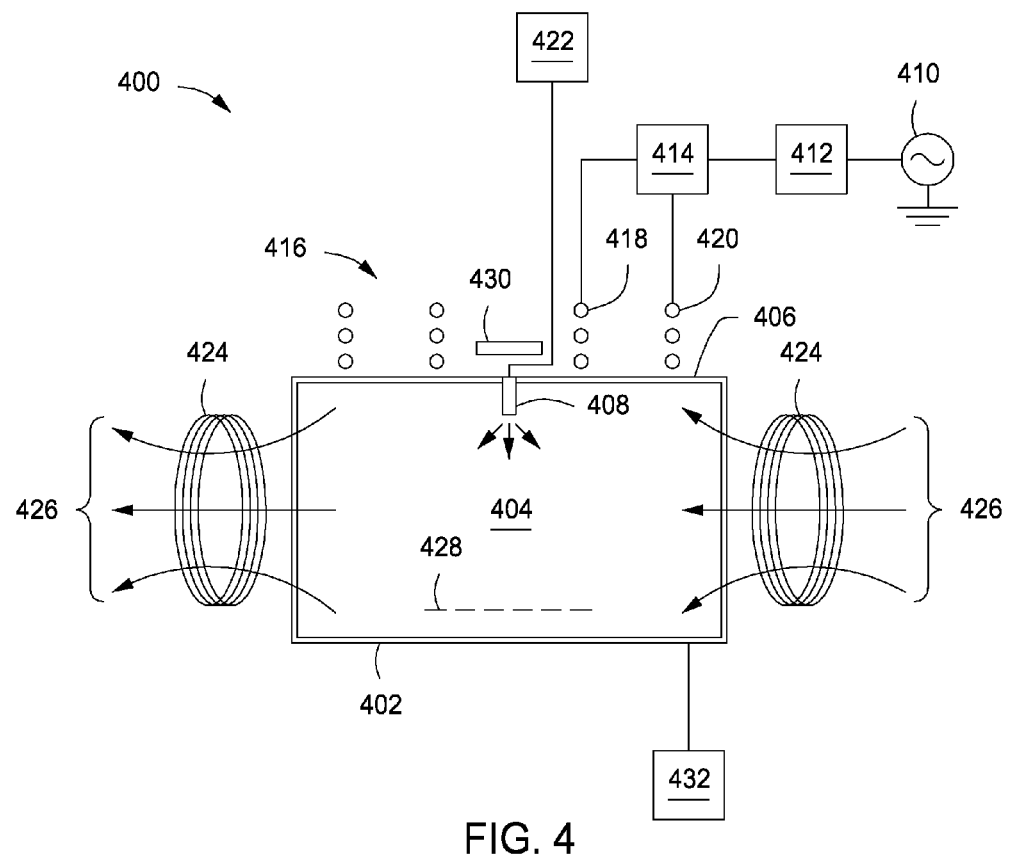
FIG. 4 depicts a schematic side view of an inductively coupled plasma reactor having a plurality of electromagnets surrounding a process chamber in accordance with some embodiments of the present invention.

FIG. 4 depicts a schematic side view of an inductively coupled plasma reactor 400 (ICP reactor) suitable for performing embodiments of the present invention. The ICP reactor 400 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable exemplary plasma reactors that may be utilized with the inventive methods disclosed herein are further described in U.S. patent application Ser. No. 12/821,609, filed Jun. 23, 2010 by V. Todorow, et al., and entitled, "INDUCTIVELY COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 400 generally includes the process chamber 402 having a conductive body (wall) and a dielectric lid 406 (that together define a processing volume 404), a substrate support pedestal disposed within the processing volume (substrate level 428 shown in phantom), an inductive plasma source 416, and a controller 432. In some embodiments, the dielectric lid 406 may be substantially flat. Other modifications of the process chamber 402 may have other types of lids such as, for example, a dome-shaped lid or other shapes. The inductive plasma source 416 is typically disposed above the lid 406 and is configured to inductively couple RF power into the process chamber 402.

The inductive plasma source 416 is disposed atop the process chamber 402. The inductive plasma source includes an RF feed structure for coupling an RF power supply 410 to a plurality of RF coils, e.g., a first RF coil 418 and a second RF coil 420. The plurality of RF coils are coaxially disposed proximate the process chamber 402 (for example, above the lid 406 of the process chamber 402) and are configured to inductively couple RF power into the process chamber 402 to form or control a plasma from process gases provided within the process chamber 402 (for example, via a gas source 422 coupled to a gas inlet 408, such as a showerhead or nozzle or the like). The relative position, ratio of diameters of each coil, and/or the number of turns in each coil can each be adjusted as desired to control, for example, the profile or density of the plasma being formed via controlling the inductance on each coil.

The RF power supply 410 is coupled to the RF feed structure via a match network 412. A power divider 414 may be provided to adjust the RF power respectively delivered to the first and second RF coils 418, 420. The power divider 414 may be coupled between the match network 412 and the RF feed structure. Alternatively, the power divider may be a part of the match network 412, in which case the match network will have two outputs coupled to the RF feed structure—one corresponding to each RF coil 418, 420. The RF power supply 410 may illustratively be capable of producing up to about 4000 W (but not limited to about 4000 W) at a tunable frequency in a range from 50 kHz to 13.56 MHz, although other frequencies and powers may be provided as desired for particular applications.

A plurality of electromagnets 424 are provided to form a desired magnetic field within the inner volume, or processing volume 404, of the process chamber 402 (e.g., as represented by magnetic field lines 426) at least at the substrate level 428, or in some embodiments, within the entire processing volume 404 above the substrate. One or more magnetic field sensors 430 may be provided to measure the magnitude and direction of the magnetic field as discussed above.

The controller 432 comprises a central processing unit (CPU), a memory, and support circuits for the CPU and facilitates control of the components of the reactor 400 and, as such, of methods of processing a substrate, such as discussed herein. The controller 432 may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits include cache, power supplies, clock circuits, input/output circuitry and subsystems, and the like. The memory stores software (source or object code) that may be executed or invoked to control the operation of the reactor 400 in the manner described below. Specifically, memory stores one or more embodiments of the methods disclosed herein, such as the method 100 or 500 discussed above. The software routine may also be stored and/or executed by a second CPU (not shown) that is remotely located from the hardware being controlled by the CPU.

While the foregoing is directed to embodiments of the present invention, other and further embodiments of the invention may be devised without departing from the basic scope thereof.

The invention claimed is:

1. A method of processing a substrate in a process chamber having a plurality of electromagnets disposed about the process chamber to form a magnetic field within the process chamber at least at a substrate level, the method comprising:
    determining a first direction of an external magnetic field present within the process chamber while providing no current to the plurality of electromagnets;
    sequentially providing a range of currents to the plurality of electromagnets to create a plurality of magnetic fields within the process chamber, each having a second direction;
    determining a first magnetic field having a desired magnitude in the second direction of the plurality of magnetic fields over the range of currents; and
    processing a substrate in the process chamber using a plasma while statically providing the first magnetic field at the desired magnitude.

2. The method of claim 1, wherein the second direction is opposite the first direction.

3. The method of claim 2, wherein the desired magnitude is a minimum magnitude of the plurality of magnetic fields.

4. The method of claim 1, wherein the second direction is not opposite the first direction.

5. The method of claim 1, wherein the desired magnitude is a minimum magnitude of the plurality of magnetic fields.

6. The method of claim 1, wherein the desired magnitude is a magnitude selected to compensate for a known incoming process skew on the substrate.

7. The method of claim 1, further comprising:
    measuring a magnitude of the plurality of magnetic fields at one or more locations about the process chamber over the range of currents.

8. The method of claim 7, wherein the magnitude of the plurality of magnetic fields is measured at a plurality of locations about the process chamber at about a substrate level.

9. The method of claim 7, wherein the magnitude of the plurality of magnetic fields is measured at a location above a lid of the process chamber.

10. The method of claim 1, wherein second direction is in substantially horizontal.

11. The method of claim 1, wherein second direction is in substantially vertical.

12. A method of processing a substrate in a process chamber having a plurality of electromagnets disposed about the process chamber to form a magnetic field within the process chamber at least at a substrate level, the method comprising:
    determining a first direction of an external magnetic field present within the process chamber while providing no current to the plurality of electromagnets;
    sequentially providing a range of currents to the plurality of electromagnets to create a plurality of magnetic fields within the process chamber, each having a second direction opposite the first direction, wherein the second direction is substantially horizontal;
    determining a first magnetic field having a desired magnitude in the second direction of the plurality of magnetic fields over the range of currents; and
    processing a substrate in the process chamber using a plasma while statically providing the first magnetic field at the desired magnitude.

13. The method of claim 12, wherein the desired magnitude is a minimum magnitude of the plurality of magnetic fields.

14. The method of claim 12, further comprising:
    measuring a magnitude of the plurality of magnetic fields at one or more locations about the process chamber over the range of currents.

15. The method of claim 14, wherein the magnitude of the plurality of magnetic fields is measured at a plurality of locations about the process chamber at about a substrate level.

16. The method of claim 14, wherein the magnitude of the plurality of magnetic fields is measured at a location above a lid of the process chamber.

* * * * *